United States Patent [19]
Aoyama et al.

[11] 4,198,700
[45] Apr. 15, 1980

[54] COLUMN DECODE CIRCUIT FOR RANDOM ACCESS MEMORY

[75] Inventors: Keizoh Aoyama, Yamato; Hiroshi Shimada, Tokyo; Eiji Noguchi, Kawasaki, all of Japan

[73] Assignee: Fujitsu Limited, Japan

[21] Appl. No.: 964,185

[22] Filed: Nov. 28, 1978

[30] Foreign Application Priority Data

Dec. 20, 1977 [JP] Japan ................................ 52/153194

[51] Int. Cl.² ............................................. G11C 8/00
[52] U.S. Cl. .............................. 365/230; 307/DIG. 5
[58] Field of Search ................. 365/230; 307/DIG. 5, 307/279, 243

[56] References Cited

U.S. PATENT DOCUMENTS

| | | | |
|---|---|---|---|
| 3,653,034 | 3/1972 | Regitz | 307/DIG. 5 |
| 3,980,899 | 9/1976 | Shimada et al. | 307/DIG. 5 |
| 3,995,171 | 11/1976 | Sonoda | 307/DIG. 5 |

OTHER PUBLICATIONS

Radzik, Multiple Image Read - Only Storage, IBM Technical Disclosure Bulletin, vol. 14, No. 12, May 1972, pp. 3737-3738.

Primary Examiner—Stuart N. Hecker
Attorney, Agent, or Firm—Staas & Halsey

[57] ABSTRACT

Disclosed is column decode circuit for a random access memory, which column decode circuit is comprised of a conventional transfer gate transistor, conventional driver transistors and a conventional load transistor. The column decode circuit further includes a chip enable gate transistor according to the present invention. The conventional gate transistor transfers data stored in a corresponding memory cell of the random access memory in accordance with a column address information. The column address information received by the conventional driver transistors connected in parallel causes the above gate transistor to be conductive or nonconductive. Accordingly, the conventional load transistor will apply a voltage of a particular voltage level (Vcc) from a voltage supply to the gate of the transfer gate transistor. The chip enable gate transistor, the load transistor and the parallely connected driver transistors are all connected in series. The thus connected column decode circuit has a very low power consumption and a high speed operating capability.

8 Claims, 6 Drawing Figures

COLUMN DECODE CIRCUIT FOR RANDOM ACCESS MEMORY

BACKGROUND OF THE INVENTION

1. Field of the Invention

The present invention relates to a column decode circuit utilized for a random access memory, and more particularly relates to a column decode circuit comprised of MOSFETs (Metal-Oxide-Semi-conductor Field Effect Transistors) utilized for a static random access memory fabricated as a single chip integrated circuit preferably using MOSFETs.

A static random access memory is comprised of a large number of memory cells which are arranged in both column and row directions thereby forming a matrix of memory cells. When an address information is applied, one of the memory cells is accessed by means of both a column decode circuit and a row decode circuit. The row decode circuit specifies, by means of a row address decoder contained therein, a row address of the memory cells forming the matrix in accordance with a row address code of the address information. The column decode circuit specifies, by means of a column address decoder contained therein, a column address of the same memory cells forming the matrix in accordance with a column address code of the address information. Thus, an accessed one of the memory cells is accessed in accordance with the address information. The column decode circuit is divided into two major parts. One part is the column address decoder, and the other part is a transfer gate transistor. The column address decoder causes the transfer gate transistor to be conductive or nonconductive in accordance with the column address code of the address information. When the transfer gate transistor becomes conductive, the data output of the corresponding memory cell is provided from the random access memory by way of the transfer gate transistor and a conventional sense amplifier.

2. Description of the Prior Art

Three kinds of typical column decode circuits for a random access memory have been proposed in the prior art. The advantage of the first typical column decode circuit, as will be explained hereinafter, resides in that it has a high speed operating capability. However, the disadvantage of this column decode circuit is that it has a very high power consumption. The advantage of the second typical column decode circuit, as will be explained hereinafter, resides in that this column decode circuit has a very low power consumption. However, the disadvantage of this column decode circuit resides in that it has a low speed operating capability. The advantage of the third typical column decode circuit, as will be explained hereinafter, resides in that this column decode circuit has both a very low power consumption and a high speed operating capability; however, the third typical column decode circuit is disadvantageous in that this column decode circuit also requires a control circuit and a special control operation.

SUMMARY OF THE INVENTION

Therefore, it is an object of the present invention to provide a column decode circuit which will exhibit both a very low power consumption and a very high speed operating capability, without introducing any additional control circuit or special control operation thereinto.

The present invention will be more apparent from the ensuing description with reference to the accompanying drawing wherein:

DESCRIPTION OF THE PREFERRED EMBODIMENT

Figure 1:
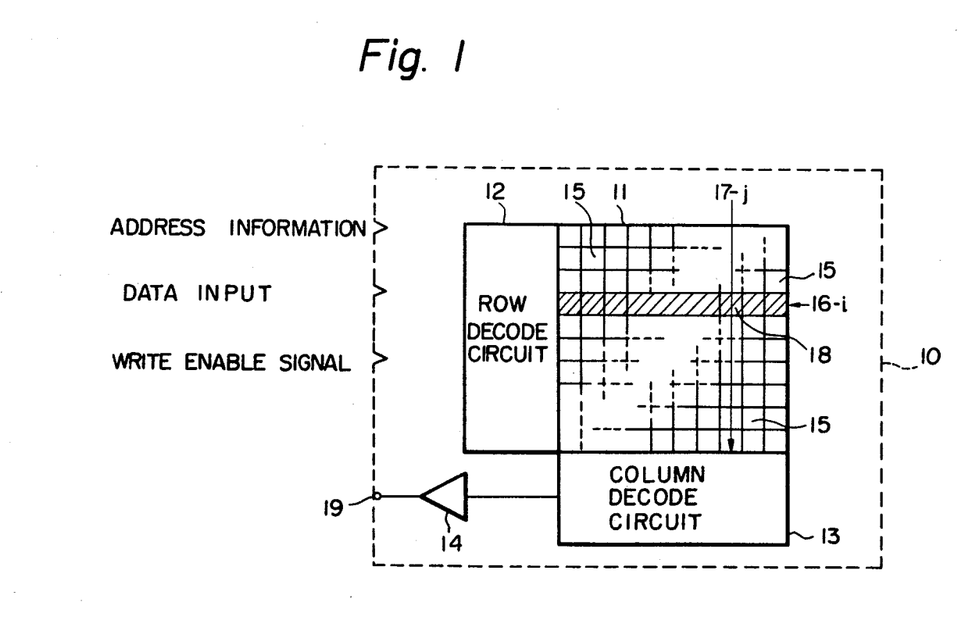
FIG. 1 is a schematic block diagram of a random access memory to which the present invention is applied.

In FIG. 1, the block within the dotted outline designated by the reference numeral 10 represents a random access memory. The random access memory 10 is comprised of a memory matrix 11, a row decode circuit 12, a column decode circuit 13 and a sense amplifier 14. The memory matrix 11 contains a large number of memory cells 15 which are arranged in both row and column directions. The random access memory 10 can receive conventional address information, data input, write enable signal and the like. When the address information is generated and applied to the random access memory 10, a row address code of the address information specifies all of the memory cells arranged along, for example, the row 16-$i$, by means of the row decode circuit 12. Then, a column address code of the address information specifies one of the memory cell 18 arranged along, for example, the column 17-$j$ and also along the specified row 16-$i$. Furthermore, data stored in the accessed memory cell 18 is provided from a data output terminal 19 by way of the column decode circuit 13 and the sense amplifier 14.

Figure 2:
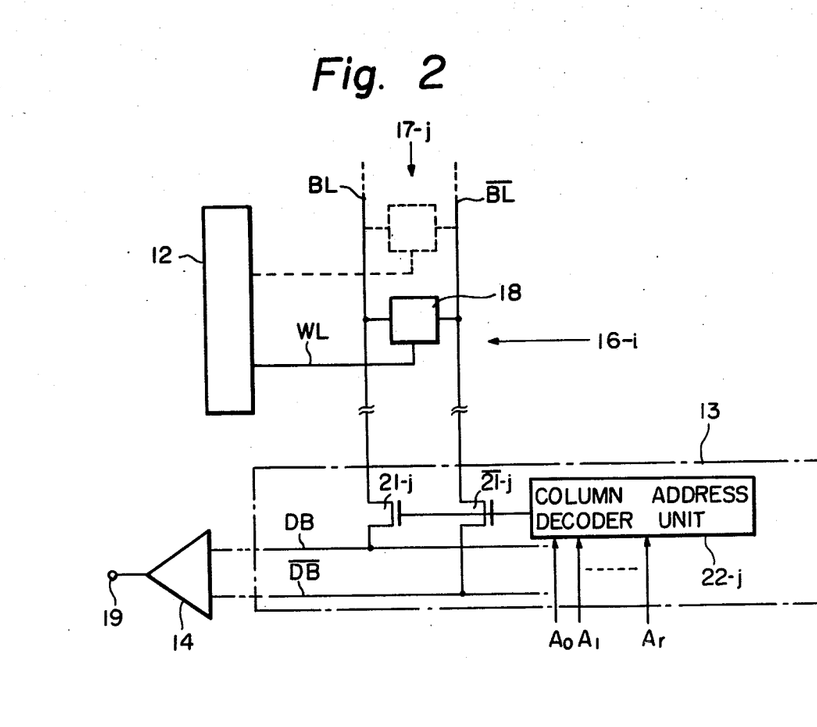
FIG. 2 illustrates a more detailed block diagram of a circuit cooperating with a memory cell 18 shown in FIG. 1.

A more detailed circuit block which cooperates with the accessed memory cell 18 is illustrated in FIG. 2.

The row decode circuit 12, the column decode circuit 13, the sense amplifier 14, the column 17-$j$ and the data output terminal 19 shown in FIG. 2 have already been described above with reference to FIG. 1. The memory cell 18 is usually provided with two bit lines, that is, a true bit line BL and a complement bit line $\overline{BL}$, and the so-called word line WL wired along the row 16-$i$. The reason for using a pair of bit lines BL and $\overline{BL}$ is commonly known by persons skilled in this art. However, in short, since the voltage of the data output produced from the memory cell 18 is very low, a differential type of amplifier is more preferably used as the sense amplifier 14 in order to obtain a much higher data output voltage. The ends of the true and complement bit lines BL and $\overline{BL}$ are provided with transfer gate transistors 21-$j$ and $\overline{21}$-$j$, respectively. The data outputs passing through the transfer gate transistors 21-$j$ and $\overline{21}$-$j$ are applied to the sense amplifier 14 by way of data buses DB and $\overline{DB}$, respectively. When the memory cell 18 is specified by the column address code of a given address information, this column address code ($A_0, A_1 \ldots A_r$) is applied to a column address decoder unit 22-*j*. Since the memory cell is now accessed, each bit of the column address code ($A_0, A_1 \ldots A_r$) is, for example, logic "0". Then, the column address decoder unit 22-*j* caused the transfer gate transistors 21-*j* and $\overline{21}$-*j* to be simultaneously conductive. Accordingly, the true and complement data outputs from the memory cell 18 are transferred to the sense amplifier 14 by way of the transistors 21-*j*, $\overline{21}$-*j* and the data buses DB and $\overline{DB}$. The present invention is specifically directed to the above column address decoder unit 22-*j* shown in FIG. 2.

Figure 3:
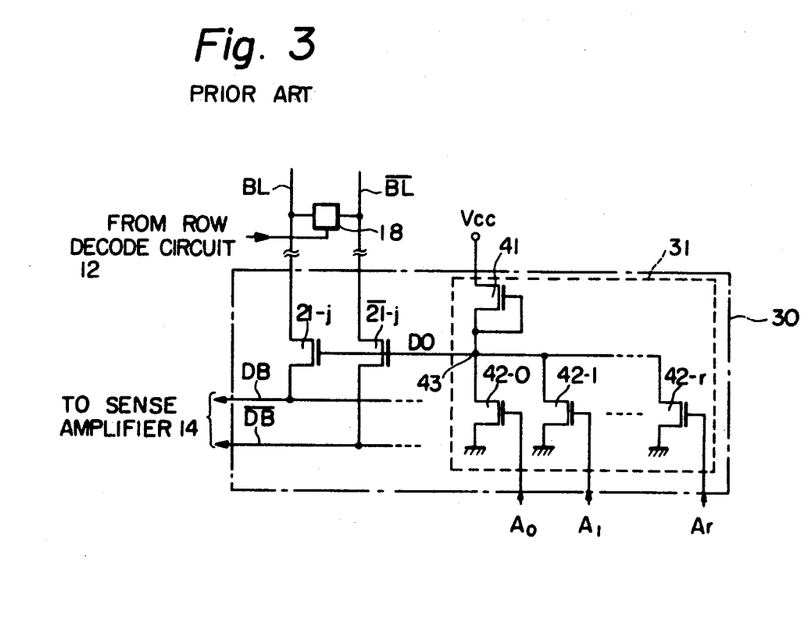
FIG. 3 illustrates a circuit diagram showing a first type of typical column decode circuit.

Three kinds of typical column decoder units for forming a column decode circuit have been proposed in the prior art. FIG. 3 illustrates a circuit diagram of a column decode circuit 30 which is comprised of a first column decoder unit 31 selected from the above three kinds of typical column decoder units. The memory cell 18, the transfer gate transistors 21-*j*, $\overline{21}$-*j*, the bit lines BL, $\overline{BL}$, the data buses DB, $\overline{DB}$ and the column address code ($A_0, A_1 \ldots A_r$) shown in FIG. 3 have already been described above with reference to FIG. 2. Reference numeral 41 represents a load transistor, and reference numerals 42-0, 42-1 . . . 42-*r* respectively represent driver transistors. The driver transistors 42-0, 42-1 . . . 42-*r*, which receive the column address code ($A_0, A_1 \ldots A_r$) at respective gate, are connected to each other in parallel. The parallely-connected driver transistors 42-0 through 42-*r*, forming one solid body, are connected in series with the load transistor 41. The transistor 41 receives a voltage of a level Vcc. The decoder output DO is obtained at a connection 43 located between the transistor 41 and the transistors 42-0 through 42-*r*. If each bit of the column address code ($A_0, A_1 \ldots A_r$) is logic "0" and the memory cell 18 is accordingly specified, then all of the driver transistors 42-0 through 42-*r* will become non-conductive. As a result a charge current is supplied from the voltage supply having the voltage level Vcc to capacitor components by way of the load transistor 41. The capacitor components are located, for example, in a gate capacitor of the transfer gate transistors 21-*j*, $\overline{21}$-*j* and a P-N junction capacitor thereof. The voltage level of the capacitor components is gradually raised to the voltage level Vcc due to the supply of the above charge current, and the status of the decoder output DO is finally changed to logic "1", which status can be used to turn on the transfer gate transistors 21-*j*, $\overline{21}$-*j*. Therefore, the data output from the memory cell 18 is transferred to the sense amplifier 14 by way of the transistors 21-*j*, $\overline{21}$-*j* which are now conductive. On the contrary, if at least one bit of the column address code ($A_0, A_1 \ldots A_r$) is logic "1", and accordingly, the memory cell 18 is not specified, then at least one of the driver transistors will become conductive. The charge current will then flow away to the ground through the conductive driver transistor, without charging the capacitor components. As a result, the status of the decoder output DO remains logic "0", and the transfer gate transistors 21-*j*, $\overline{21}$-*j* will still remain nonconductive. Therefore, data output from the memory cell 18 is not applied to the sense amplifier 14.

Figure 4:
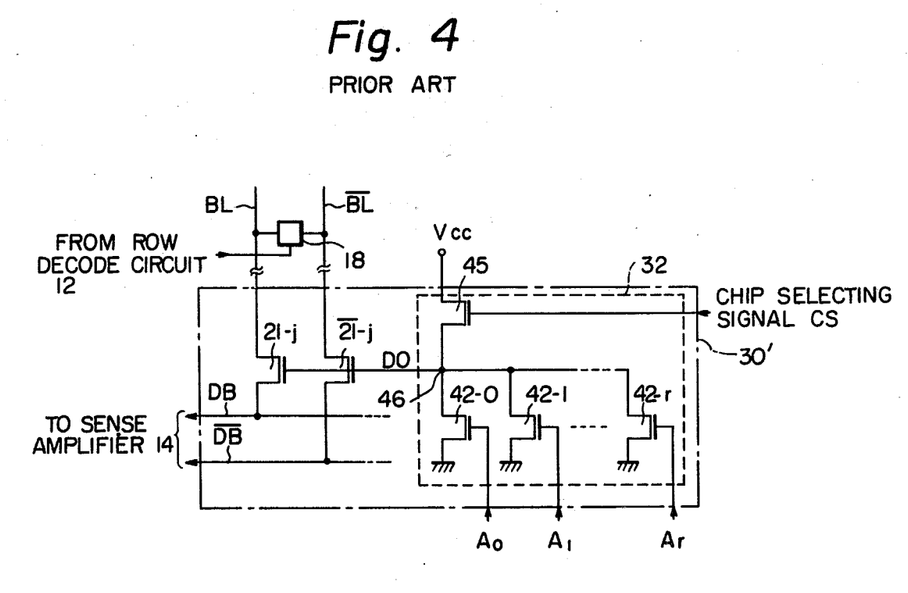
FIG. 4 illustrates a circuit diagram showing a second type of typical column decode circuit.

In the first column decoder unit 31, the driver transistors 42-0 through 42-*r* are made of MOSFETs, especially enhancement-mode MOSFETs. The load transistor 41 is also made of a MOSFET, especially a depletion-mode MOSFET. Accordingly, no voltage drop will occur across the load transistor 41 while the charge current flows therethrough for charging the capacitor components. This is because, the load transistor 41, made of a depletion-mode MOSFET, has the characteristics of a negative threshold voltage. Since no voltage drop occurs across the transistor 41 and, at the same time, since the source of the load transistor 41 is shorted to the gate thereof, the logic "1" level of the decoder output DO is approximately the same as the voltage level Vcc, when all of the driver transistors 42-0 through 42-*r* are nonconductive. Due to the reason that the logic "1" level of the decoder output DO is of a high level approximately equal to the voltage level Vcc, the capacitor components are very rapidly charged by the charge current. Therefore, the transfer gate transistors 21-*j*, $\overline{21}$-*j* are turned on very rapidly and thus causes the column decode circuit 30 to advantageously have a very high speed operating capability. However, this decode circuit 30 has a disadvantage because it exhibits a high power consumption. Generally, many chips of random access memories (see reference numeral 10 in FIG. 1) are arranged together as one body, on a printed card in order to obtain a large memory capacity. In the above-described printed card, only desired random access memories can be activated by the so-called chip selecting signals. The remaining random access memories are not activated, because no chip selecting signals are applied thereto. There is no gate means in the column decode circuit 30, for receiving the chip selecting signals. Accordingly, on the printed card, many chips of random access memories each comprising, a column decode circuit 30, are all activated regardless of whether or not each random access memory is selected. Consequently, the printed card which includes many column decode circuits 30 has a very high power consumption. Specifically, in FIG. 3, if at least one of the driver transistors belonging to a nonaccessed memory cell is conductive, then an undesired continuous current will flow from the voltage supply (Vcc) to the ground through the load transistor 41 and the above conductive driver transistor, and thus causes the above described undesired power consumption. FIG. 4 illustrates a circuit diagram of a column decode circuit 30' which is comprised of a second column decoder unit 32 selected from the above-mentioned three kinds of typical decoder units. In FIG. 4, members which are identical with members shown in FIG. 3 are designated by the same reference numerals and symbols as those used in FIG. 3. As is apparent from FIGS. 3 and 4, the load transistor 41 shown in FIG. 3 is substituted by a chip specifying transistor 45 shown in FIG. 4 which receives, at its gate, the chip selecting signal CS. The chip specifying transistor 45 acts, at the same time, as a load transistor. The advantage of the column decoder circuit 30' resides in that the second column decoder unit 32 has a very low power consumption. Because, when the chip selecting signal CS is not applied to the chip specifying, transistor 45, the above-mentioned continuous current flowing from the voltage supply (Vcc) to the ground will not occur regardless of whether or not at least one of the driver transistors is conductive. When chip selecting signal CS having logic "1" is applied to the transistor 45 and at the same time each bit of the column address code ($A_0, A_1 \ldots A_r$) is logic "0", the data output from the memory cell 18 is transferred to the sense amplifier 14. The above-mentioned continuous current flow will usualy occur in only the selected chips forming the random access memories.

However, the second column decoder unit 32 creates a disadvantage in that the column decode circuit 30' has a low speed operating capability. In this column decoder unit 32, the chip specifying transistor 45 is made of a MOSFET, especially an enhancement-mode MOSFET. Accordingly, a relatively large voltage drop occurs across the transistor 45 when the charge current is flowing therethrough for charging the capacitor elements. This is because, the transistor 45 which is made of the enhancement-mode MOSFET, exhibits the characteristics of a positive threshold voltage (Vth). The threshold voltage Vth is usually about +0.9 V, while the voltage level Vcc is usually about 5.0 V. As a result, the logic "1" level of the decoder output DO is approximately the level of (Vcc-Vth). Due to the reason that the logic "1" level of the decoder output DO is of a considerably low level approximately equal to the voltage level (Vcc-Vth), the capacitor components are slowly charged by the charge current and then cause the transfer gate transistors 21-$j$, $\overline{21}$-$j$ to turn on slowly, thus creating a disadvantageous condition wherein the column decode circuit 30' has a very low speed operating capability.

Figure 5:
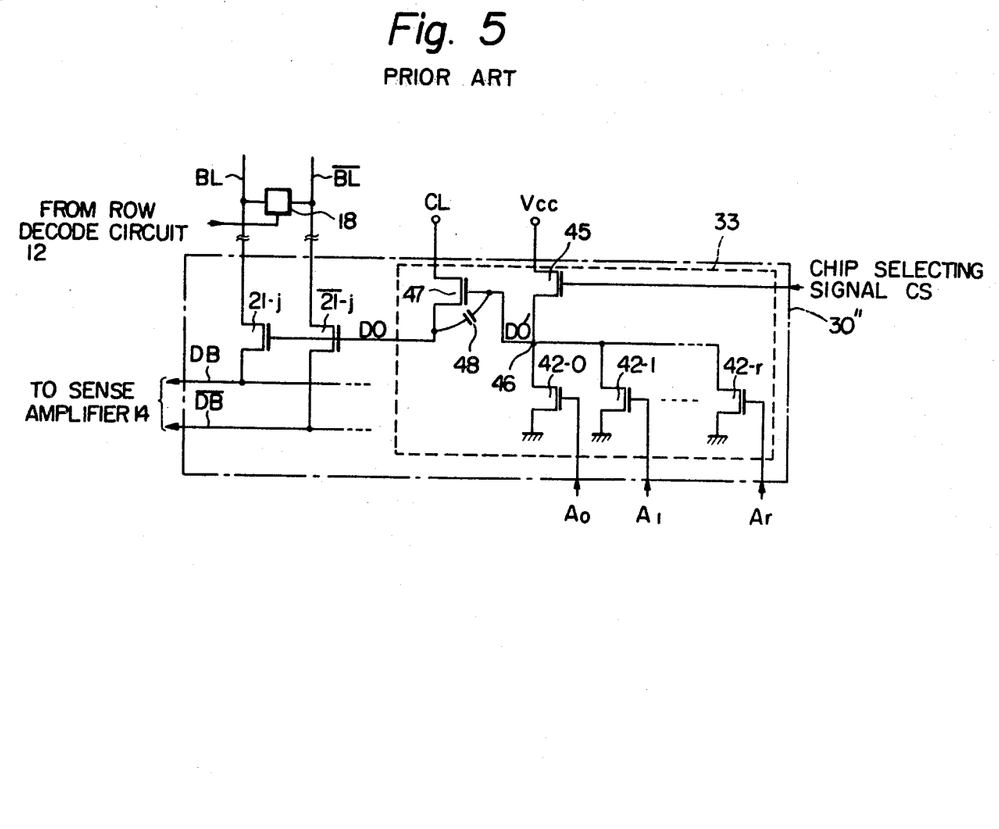
FIG. 5 illustrates a circuit diagram showing a third type of typical column decode circuit.

FIG. 5 illustrates a circuit diagram of a column decode circuit 30" which is comprised of a third column decoder unit 33 selected from the above-mentioned three kinds of typical decoder units. In FIG. 5, the members which are identical with those shown in FIGS. 3 and 4 are designated by the same reference numerals and symbols as those used in FIGS. 3 and 4. As is apparent from FIGS. 4 and 5, an additional transistor 47 is employed between a connection 46 and the transfer gate transistors 21-$j$, $\overline{21}$-$j$. A bootstrap capacitor 48 is connected between the gate and the source of the transistor 47. A time-controlled clock signal CL is applied to the drain of the transistor 47. The transistor 47 is made of a MOSFET, especially an enhancement-mode MOSFET. The chip specifying transistor 45 is useful, as is already explained above with reference to FIG. 4, for obtaining a low power consumption. The transistor 47, the bootstrap capacitor 48 and the time-controlled clock signal CL are all advantageous for increasing the logic "1" level of the decoder output DO' from the connection 46. As previously mentioned, the logic "1" level of the decoder output DO' is of a considerably low level approximately equal to the level (Vcc-Vth) when the chip selecting signal CS is applied to the transistor, and at the same time, each bit of the column address code (A$_0$, A$_1$ . . . A$_r$) is logic "0". Shortly after the generation of the chip selecting signal CS, the clock signal CL having a voltage level Vcc is applied to the drain of the transistor 47 with a predetermined delay with respect to the selecting chip signal CS. Then the source voltage of the transistor 47, i.e., the decoder output DO to be applied to the transfer gate transistors 21-$j$, $\overline{21}$-$j$, reaches a lower level which is approximately equal to the level (Vcc-Vth-V'th). The symbol of V'th represents the positive threshold voltage of the transistor 47. In this case, the source voltage (Vcc-Vth-V'th) is fed back to the gate of the transistor 47 by means of the bootstrap capacitor 48, thereby the logic "1" level of the decoder output DO is increased to a high level which is approximately equal to the voltage level Vcc. Due to the reason that the logic "1" level of the decoder output DO is of a high level approximately equal to the voltage level (Vcc), the capacitor components are very rapidly charged by the charge current flowing through the transistor 47 and thus causes the transfer gate transistor 21-$j$, $\overline{21}$-$j$ to turn on very rapidly. As a result, the third column decoder unit 33 advantageously causes the column decode circuit 30" to have both a very low power consumption and a very high speed operating capability. However, the third column decoder unit 33 has the following disadvantages in that (1) the column decode circuit 30" requires an additional control circuit (not shown) for producing the time-controlled clock signal CL, (2) a special control operation is necessary for interconnecting the time-controlled clock signal CL and the chip selecting signal CS, and (3) it is impossible to maintain the higher voltage level of the decoder output DO for a long period of time because the higher source voltage level (Vcc) of the transistor 47 gradually decreases to the lower voltage level (Vcc-Vth-V'th) due to a discharge of the bootstrap capacitor 48.

Figure 6:
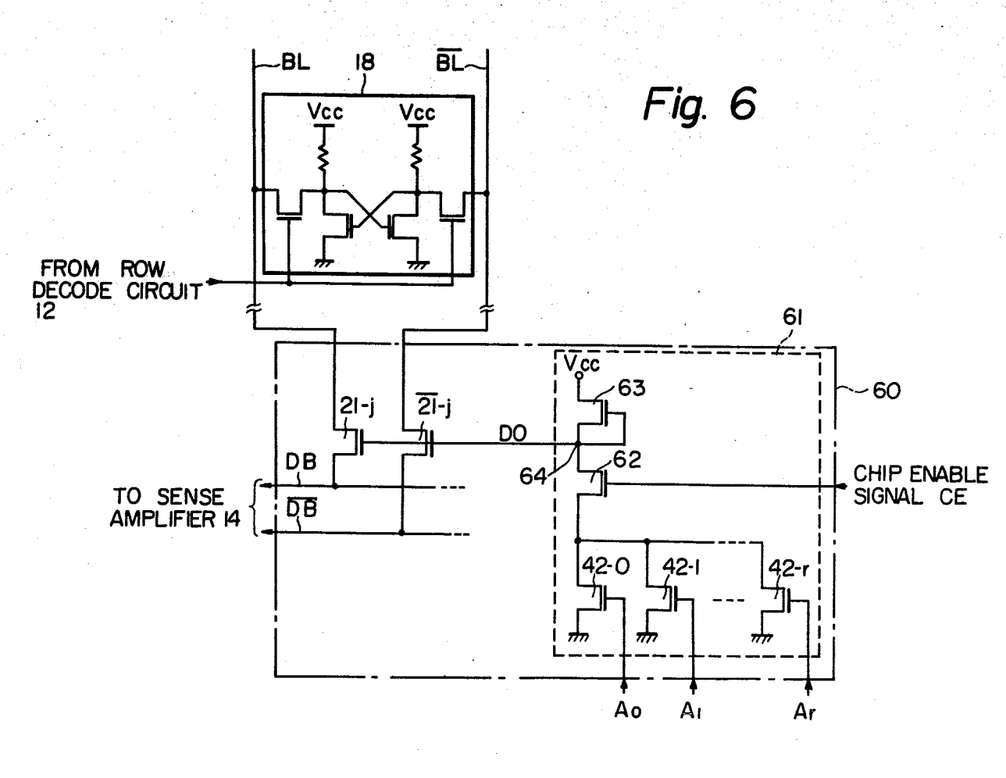
FIG. 6 illustrates a circuit diagram showing the embodiment of a column decode circuit according to the present invention.

FIG. 6 illustrates a circuit diagram of a column decode circuit according to the present invention. In FIG. 6, the members which are designated by the same reference numerals and symbols as those shown in FIGS. 3, 4 and 5 are the same as those shown in these FIGS. 3, 4 and 5. In FIG. 6, the reference numeral 60 represents a column decode circuit and the reference numeral 61 represents a column decoder unit. In the column decoder unit 61, a chip enable transistor 62 is newly introduced therein. The chip enable transistor 62 is connected between a load transistor 63 and the parallely-connected driver transistors 42-0 through 42-$r$. The voltage level Vcc of a voltage supply (not shown) is supplied to the load transistor 63. A chip enable signal CE is applied to the gate of the chip enable transistor 62. The chip enable signal CE can be, for example, the chip selecting signal CS. As previously mentioned, the driver transistors 42-0 through 42-$r$ receive the column address code (A$_0$, A$_1$ . . . A$_r$) at respective gates thereof. The decoder output DO is obtained at a connection 64 located between the transistors 62 and 63. The logic "1" of the decoder output DO causes the transistors 21-$j$, $\overline{21}$-$j$ to be conductive. Accordingly, the data output from the memory cell 18 is transferred to the sense amplifier 14.

The load transistor 63 is made of a MOSFET, especially a depletion-mode MOSFET, the chip enable transistor 62 is made of a MOSFET, especially an enhancement-mode MOSFET. The driver transistors 42-0 through 42-$r$ are, as previously mentioned, made of enhancement-mode MOSFETs. In the case where the random access memory containing the memory cell 18 is not selected by the chip selecting signal, and accordingly, logic "0" of the chip enable signal CE is applied to the gate of the transistor 62, the transistor 62 will then be turned off. Therefore, no continuous current can flow from the voltage supply (Vcc) to the ground through the driver transistors regardless of whether at least one of the driver transistors is conductive or nonconductive. As a result, the column decode circuit 60 has a low power consumption, and thus creates one of the aforementioned advantages of the present invention. In the case where the random access memory containing the memory cell 18 is selected by the chip selecting signal and at the same time the memory cell 18 is accessed by the address information, logic "1" of the chip enable signal is applied to the gate transistor 62, and the column address code (A$_0$, A$_1$ . . . A$_r$), each bit of which is logic "0", is applied to the respective gates of the driver transistors 42-0 through 42-$r$. Thereafter, the voltage level of the capacitor components is gradually increased to the voltage level Vcc due to the supply of the charge current by way of the load transistor 63, and then the status of the decoder output DO is changed to logic "1". This load transistor 63 is made of the depletion-mode MOSFET. Since the depletion-mode MOSFET has the characteristics of a negative threshold voltage, there is no voltage drop across the transistor 63, and the logic "1" level of the decoder output DO thus increases to a higher level approximately equal to the voltage level Vcc. Consequently, the capacitor components are very rapidly charged by the charge current which causes the transfer gate transistors 21-j, $\overline{21}$-j to be turned on very rapidly, and thus creates a second advantage wherein the column decode circuit 60 has very high speed operating capability. This second advantage of the column decode circuit 60 is similar to the aforementioned advantages of the column decode circuits 30 and 30". The third advantage of the column decode circuit 60 resides in that this circuit 60 requires no additional control means similar to the control means described with reference to FIG. 5 and no special control operation. The above-described column decode circuit 30", however, does require a further control means and a special control operation.

Another advantage of the column decode circuit 60 resides in that the so-called speed-power product can be reduced when the column address code ($A_0, A_1 \ldots A_r$) is varied at the time the chip enable signal CE is logic "1". This is because the source of the transistor 63 is shorted to the gate thereof and then used for producing the decoder output DO. More specifically, the so-called mutual conductance $g_m$ of the transistor 63 can be maintained at a constant high value by shorting the source of the transistor 63 to the gate thereof. However, the process of shorting the source to the gate of the transistor 63 is not an essential feature of the present invention.

The chip enable signal CE is preferably a conventional chip selecting signal CS. However, the signal CE can be utilized not only as the signal CS but also as another control signal. For example, the signal CE may be utilized for activating individual memory cells.

As mentioned above, according to the present invention, by introducing a simple MOSFET device into the conventional decode circuit, the column decode circuit 60 can be constructed so as to have a very low power consumption and a very high speed operating capability.

What is claimed is:

1. A column decode circuit for a random access memory, having a memory matrix means including a plurality of memory cells, comprising:
    a column address code source means for providing a column address code signal;
    a column decoder unit which is comprised of a plurality of driver transistors, each of which receives, at a respective gate thereof, a column address code, and a decoder output means which is operatively connected to the driver transistors, and a transfer gate means which controls the transfer of a data output from a corresponding memory cell in said memory matrix in accordance with a decoder output produced from the decoder output means, wherein the decoder output means is comprised of a voltage supply means, a load transistor which is connected to said voltage supply means and a chip enable transistor which receives at its gate a chip enable signal for accessing the corresponding memory cell, said chip enable transistor being operatively connected between the load transistor and the driver transistors, said decoder output being provided from a connection located between said load transistor, and said chip enable transistor, and dependent upon said chip enable signal and said column address code signal.

2. A column decode circuit as set forth in claim 1, wherein each of said driver transistors comprises an enhancement-mode MOSFET, said load transistor comprises a depletion-mode MOSFET and said chip enable transistor comprises an enhancement-mode MOSFET, and wherein the drain of said load transistor is connected to said voltage supply means, the source of the load transistor is connected to the drain of said chip enable transistor and the source of said chip enable transistor is connected to the drains of said driver transistors.

3. A column decode circuit as set forth in claim 2, wherein the source of said load transistor is shorted to the gate thereof.

4. A column decode circuit for a random access memory, having a memory matrix means including a plurality of memory cells, comprising:
    a column address code source means for providing a column address signal;
    a column decoder unit comprising a plurality of driver transistors and a decoder output means, each of said plurality of driver transistors receiving, at a respective gate thereof, a column address code signal;
    a chip enable signal source means for providing a chip enable signal;
    a transfer gate means for controlling the transfer of data from a corresponding memory cell in said memory matrix in accordance with an output from said column decoder unit; said decoder output means comprising a voltage supply means, a load transistor operatively connected to said voltage supply means, and a chip enable transistor, operatively connected between said load transistor and said plurality of driver transistors, said chip enable transistor receiving at its gate said chip enable signal for accessing the corresponding memory cell, and
    said decoder output being provided from a connection between said load transistor and said chip enable transistor, and dependent upon said chip enable signal and said column address code signal.

5. A column decode circuit as set forth in claim 4, wherein each of said plurality of driver transistors comprises an enhancement-mode MOSFET, said load transistor comprises a depletion-mode MOSFET, said chip enable transistor comprises an enhancement-mode MOSFET, and wherein the drain of said load transistor is operatively connected to said voltage supply means, the source of said load transistor is operatively connected to the drain of said chip enable transistor and the source of said chip enable transistor is operatively connected to the drains of said plurality of driver transistors.

6. A column decode circuit as set forth in claim 5, wherein the source of said load transistor is shorted to the gate thereof.

7. An improved column decode circuit for a random access memory, having a memory matrix means including a plurality of memory cells, wherein a column address code source means provides a column address code signal to a plurality of driver transistors, said driver transistors being operatively connected to a decoder output means, and wherein a transfer gate means controls the transfer of a data output from a corresponding memory cell in said memory matrix, wherein the improvement comprises:

a decoder output means which comprises a voltage supply means, a load transistor connected to said voltage supply means, and a chip enable transistor operatively connected between said load transistor and said plurality of driver transistors, said chip enable transistor receiving at its gate a chip enable signal for accessing the corresponding memory cell, wherein said decoder output is provided at a connection between said load transistor and said chip enable transistor, said decoder output dependent upon said chip enable signal and said column address code signal.

8. A column decode circuit for a random access memory, having a memory matrix means including a plurality of memory cells, comprising: a column address code source means for providing a column address code signal; a chip enable signal source means for providing a chip enable signal; a voltage supply means; a column decoder unit comprising a plurality of enhancement-mode MOSFET driver transistors, a depletion-mode MOSFET load transistor, and an enhancement-mode MOSFET chip enable transistor, wherein the drain of said load transistor is operatively connected to said voltage supply means, the source of said load transistor is operatively connected to the gate of said load transistor and to the drain of said chip enable transistor and to the drain of said chip enable transistor, the gate of said chip enable transistor is operatively connected to said chip enable signal source means, the source of said chip enable transistor is operatively connected to the drains of said plurality of driver transistors, the respective gates of each of said plurality of driver transistors are operatively connected to said column address code sourde means, and the sources of said plurality of driver transistors are connected to a ground, and a transfer gate means for controlling the transfer of data from a corresponding memory cell in said memory matrix means in accordance with an output from said column decoder unit, wherein said decoder output is provided at the connection of the source of said load transistor, the gate of said load transistor, and the drain of said chip enable transistor.

* * * * *